United States Patent [19]

Chu

[11] 4,348,559

[45] Sep. 7, 1982

[54] ROTARY SWITCH USING A FLEXIBLE CIRCUIT MEMBER

[75] Inventor: Pak-Jong Chu, Nepean, Canada

[73] Assignee: Northern Telecom Limited, Montreal, Canada

[21] Appl. No.: 212,272

[22] Filed: Dec. 3, 1980

[51] Int. Cl.$^3$ .......... H01L 19/54

[52] U.S. Cl. .......... 200/11 R; 200/11 DA; 200/16 R; 200/292

[58] Field of Search .......... 200/11 R, 16 R, 16 A, 200/61.53, DIG. 45, 153 R, 161, 61.88-61.91, 153 P, 292

[56] References Cited

U.S. PATENT DOCUMENTS

| | | | |
|---|---|---|---|
| 3,435,165 | 3/1969 | Lombard | 200/61.89 |
| 3,452,175 | 6/1969 | Wilkes | 200/240 |
| 3,651,287 | 3/1972 | Rubenstein | 200/11 R |
| 3,651,293 | 3/1972 | Hoffman | 200/61.89 X |
| 3,745,288 | 7/1973 | Reimer | 200/16 A X |

OTHER PUBLICATIONS

IBM Tech. Disc. Bulletin, F. J. Bolda et al; "Punched Card Reader", vol. 12, No. 11, Apr. 1970, p. 1920.

IBM Tech. Disc. Bulletin, J. W. Rudolph; Slide Selector Switch", vol. 22, No. 6, Nov. 1979, pp. 2324, 2325.

Rolamite: A New Mechanical Design Concept; by D. F. Wilkes, Mar. 1969, Sandia Laboratories Publishers, pp. 59, 60, 61 included plus title page.

*Primary Examiner*—James R. Scott

*Attorney, Agent, or Firm*—Sidney T. Jelly

[57] ABSTRACT

A switch using one or more flexible circuit members provides for rolling contact between circuit members. One circuit member is attached to and wraps round a roller, and the other circuit member, which may be flexible or rigid is supported so that as the roller rotates it rolls, the circuit member attached to the roller changing its contact position with the other circuit member. Conductive patterns on the circuit members are moved into contact and out of contact with each other and can provide varying forms of switching arrangements, for example, normally made to break, normally broken to make, and transfer. Electronic devices can be mounted on either or both circuit members.

6 Claims, 6 Drawing Figures

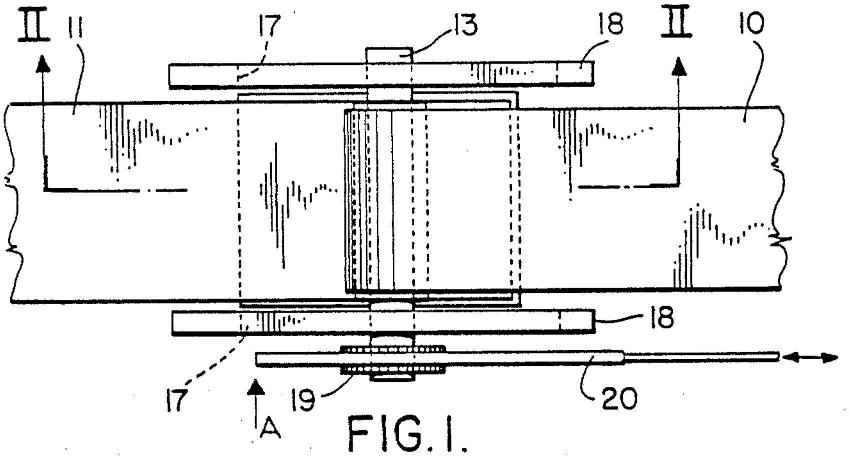
FIG. 1.
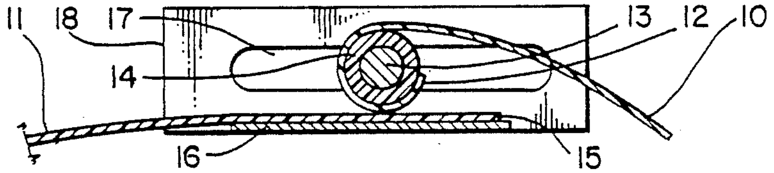
FIG. 2.
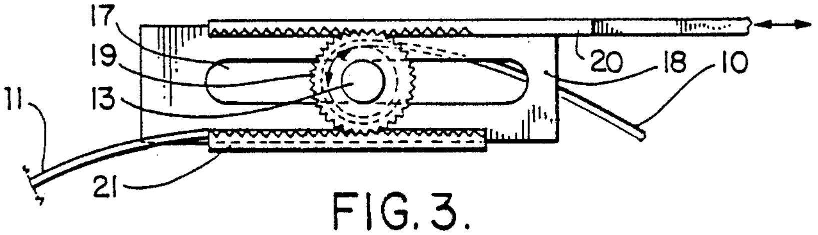
FIG. 3.
FIG. 4.
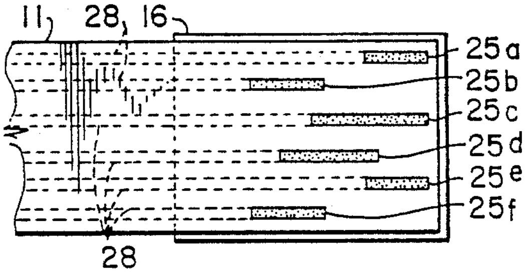
FIG. 5.
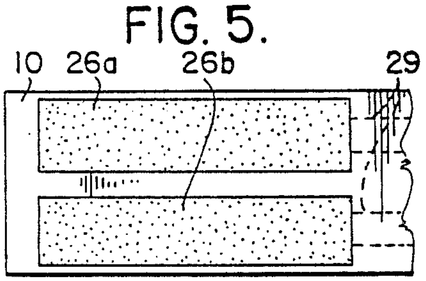
FIG. 6.
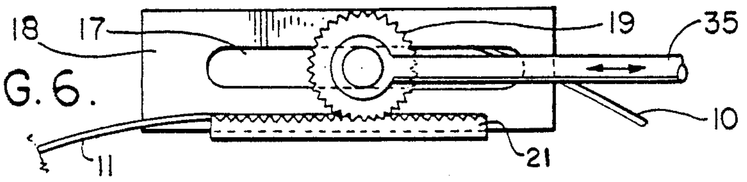

ROTARY SWITCH USING A FLEXIBLE CIRCUIT MEMBER

BACKGROUND OF THE INVENTION

This invention relates to rotary switches using a flexible circuit member.

Increasingly, printed circuits, and particularly flexible printed circuits, are being used in various types of apparatus and components. In many instances switches are required in association with such circuits. Usually the switches are preassembled devices attached to the circuit member, as by soldering.

The present invention uses two flexible circuit members, or a combination of a flexible circuit member and a rigid circuit members, to form a switch, relative rotational or rolling action between the circuit members causing the alteration of switching conditions. A variety of types of switch can be provided, move to make, move to break, move to transfer for example, and combinations of these. The two circuit members may both carry printed circuits forming electronic components or having electronic components connected to them, with specific parts of the circuits adapted to form the switch. Alternatively one circuit member may be provided only to act as one switch member, or may be a power supply circuit.

SUMMARY OF THE INVENTION

Broadly the invention comprises two circuit members, with one circuit member attached to and wrapping around a roller. The other circuit is supported so that as the roller is rotated or rolled, the circuit attached to the roller changes its contact position and also the position which it contacts on the other circuit. The opposed surfaces of the two circuit members each carry a conductive pattern, the patterns moving into contact and out of contact on movement of the roller.

BRIEF DESCRIPTION OF THE DRAWINGS

The invention will be readily understood by the following description of an embodiment, by way of example, in which:

FIG. 1 is a top plan view of a switch;

FIG. 2 is a cross-section on the line II—II of FIG. 1;

FIG. 3 is a side view in the direction of arrow A in FIG. 1;

FIG. 4 is a plan view of the conductive pattern on the stationary flexible circuit;

FIG. 5 is a development of the conductive pattern on the moving circuit.

FIG. 6 is a side view of an alternative arrangement to that of FIG. 3.

DETAILED DESCRIPTION OF PREFERRED EMBODIMENTS

As illustrated in FIGS. 1, 2 and 3, a switch comprises two circuit members 10 and 11, the end 12 of the flexible circuit member 10 being attached to and wrapping round a roller 13 having a layer resilient material 14 on its periphery. The circuit members are in overlapping relationship and the end 15 of the other circuit member 11 is mounted on a support member 16. Circuit member 11 can be rigid or, as illustrated flexible. The support member 16 can be dispensed with if circuit member 11 is rigid. The ends of the roller 13 are mounted in slots 17 formed in support members 18. At one end of the roller 13 is a pinion gear 19 and a rack 20 engages with the pinion. Pushing or pulling on the rack 20 rotates the roller 13 and causes flexible circuit member 10 to move over the circuit member 11, bringing different parts of the two circuit members into contact with each other, by one circuit rolling over the other. A stationary rack 21 may be provided to ensure effective operation.

FIG. 4 is a plan view of one contact pattern for the circuit member 11. Contact areas 25*a-f* are formed on the top surface of the circuit member, the size, shape, member and relative positioning of the areas 25 depending upon the particular switching functions required.

FIG. 5 is a developed view of one contact pattern for the circuit member 10. In the example two contact areas 26*a* and 26*b* are provided on the surface of the circuit member which is in contact with the top surface of circuit member 11. The member, size, shape and relative positioning of the contact areas 26 can also vary.

In the example illustrated, a contact area 26 is wide enough to move into contact with three of the contact areas 25. Assuming, in FIGS. 1, 2 and 3, that the roller 13 is initially at the extreme right hand end, then contact area 26*a* will be in contact with, and making electrical connection between, the contact areas 25*a* and 25*c*. Contact area 26*b* will be in contact with contact area 25*e*.

As the roller 13 rolls, to the left in FIGS. 1, 2 and 3, first contact area 26*b* will move into contact with contact areas 25*d*, connecting it electrically to 25*e*. Continued movement then causes contact areas 26*b* to move out of contact with area 25*e* and contact area 26*a* to move out of contact with area 25*a*. As movement continues contact areas 26*a* and 26*b* make contact with areas 25*b* and 25*f*, then breaks contact between areas 26*a* and 25*c* and then breaks contact between areas 26*b* and 25*d*. Contact areas 25*a*, 25*b* and 25*c*, with area 26*c*, form a transfer switch arrangement, with connection always maintained between 25*c* and 25*a* or 25*b*, until contact with 25*c* is broken. With contact areas 25*d*, 25*e* and 25*f*, transfer is from 25*e* to 25*f* with a distinct break between.

Connections are made from the contact areas 25*a* to 25*f* to other circuit parts, as indicated by dotted lines 28 in FIG. 4. The contact areas 25*b* can be just isolated areas merely acting as cross-connectors for areas 25*a* to 25*f*, or connections can be made to areas 26*a* and 26*b*, such as a power source, or to other circuit parts, as indicated by dotted lines 29 in FIG. 5.

Normally the switch mechanism will be mounted on one end of a circuit member, as in FIGS. 1, 2 and 3. However, the switch can be positioned at any part of a circuit, that is circuit member 11 can extend past the switch to the right, in FIGS. 1, 2 and 3. The support member 16, roller support members 18 and the rack 21 can be a single molding, or an assembly, with the flexible circuit 11 attached to the support member 16 by adhesive or other means. The rack 20 can be actuated by any suitable means, such as a flexible cable of the Bowden type, the cable in turn actuated by a further member. For example, as a hook switch for a telephone set, the handset would push down a knob when replaced, this axial movement of the knob being translated by the cable into linear movement of the jack 20. Instead of only being on one end of the roller 13, pinions and rack can be positioned at both ends of roller 13, the racks connected by a yoke. This can reduce the possibility of the roller skewing. Even just a further pinion and a rack similar to rack 21, on the other end of the roller, would assist in maintaining correct rolling of the roller 13.

FIG. 6 illustrates an alternative arrangement in which the roller 13 is actuated by a push-pull rod 35 mounted directly on an axial extension of the roller. The rod 13 can have a yoke form at its end, fitting on axial extensions at each end of the roller 13.

The actual size of the switch can be very much smaller than as illustrated. Basically, the parts can be molded and be very light and readily attached to a flexible circuit.

What is claimed is:

1. A rotary switch using a flexible circuit member, comprising:

a support member;

a first circuit member having at least a portion supported on said support member and a plurality of contact areas on a surface of said portion, said contact areas in a pattern extending in a longitudinal direction on said surfaces;

a side member extending along each side of said support member;

a roller mounted at opposite ends in slots in said side members, the roller mounted for rotation about an axis transverse of said longitudinal direction and for movement along said longitudinal direction;

a second, flexible, circuit member attached at one end to said roller and adapted to wrap around said roller on rotation thereof, the flexible circuit member held in contact with said first circuit member by said roller;

said flexible circuit member having at least one contact area on a surface thereof and extending in said longitudinal direction, said surface on said flexible circuit member in rolling contact with said surface on said first circuit member.

means for moving said roller in said longitudinal direction, the roller rotating about said axis, whereby contact between said contact area on said flexible circuit member and said contact areas on said first circuit member is varied.

2. A switch as claimed in claim 1, wherein said first circuit member is a flexible circuit member.

3. A switch as claimed in claim 1, said means for moving said roller comprising a flexible cable.

4. A switch as claimed in claim 1, including a pinion gear on at least one end of said roller, and a rack mounted relative to said pinion, said pinion in engagement with said rack, longitudinal movement of said rack moving said pinion on said rack to rotate said roller.

5. A switch as claimed in claim 1, including at least two contact areas on said surface of said second circuit member, each contact area on the second circuit member associated with a predetermined number of contact areas on said first circuit member.

6. A switch as claimed in claim 1, including a pinion gear on at least one end of said roller, and a rack mounted on said support member, said pinion gear in engagement with said rack.

* * * * *